(12) United States Patent
Schmid et al.

(10) Patent No.: US 8,790,522 B1
(45) Date of Patent: Jul. 29, 2014

(54) CHEMICAL AND PHYSICAL TEMPLATES FOR FORMING PATTERNS USING DIRECTED SELF-ASSEMBLY MATERIALS

(71) Applicant: GLOBALFOUNDRIES Inc., Grand Cayman (KY)

(72) Inventors: Gerard M. Schmid, Rensselaer, NY (US); Richad A. Farrell, Albany, NY (US); Ji Xu, Watervliet, NY (US); Jason R. Cantone, Mechanicville, NY (US); Moshe E. Preil, Sunnyvale, CA (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 13/764,051

(22) Filed: Feb. 11, 2013

(51) Int. Cl.
*H01B 13/00* (2006.01)

(52) U.S. Cl.
USPC ............ 216/17; 216/41; 216/49; 216/55; 216/58; 216/83; 438/694

(58) Field of Classification Search
CPC ............ H01L 21/31144; H01L 21/0337; H01L 21/3086; H01L 21/3088; H01L 21/0338; H01L 21/3081; H01L 21/32139; H01L 21/0271; H01L 21/28; H01L 21/308; H01L 21/31116; H01L 29/78; H01L 21/02107; H01L 21/02063; H01L 21/02274; H01L 21/0274; H01L 21/3065; H01L 21/311; H01L 21/31138; H01L 21/768; H01L 21/76898; H01L 21/823431; H01L 21/845; H01L 2924/00013; H01L 21/02181; H01L 21/0276; H01L 21/302; H01L 21/306; H01L 21/30604; H01L 21/3085; H01L 21/31111; H01L 21/31122; H01L 21/461; H01L 21/76802; H01L 21/76805; H01L 2224/29298; H01L 2924/00011; H01L 29/02; H01L 29/06; H01L 29/0665; H01L 29/401; H01L 29/4236; H01L 29/66795; H01L 29/7397; H01L 21/02; H01L 21/0209; H01L 21/0212; H01L 21/02126; H01L 21/02189; H01L 21/02233; H01L 21/02271

See application file for complete search history.

(56) References Cited

U.S. PATENT DOCUMENTS

| | | | |
|---|---|---|---|
| 7,964,107 B2 * | 6/2011 | Millward | ............ 216/17 |
| 7,977,242 B2 * | 7/2011 | Sadjadi et al. | ........... 438/694 |
| 2002/0158342 A1 | 10/2002 | Tuominen et al. | |
| 2006/0165984 A1 | 7/2006 | Miguez et al. | |
| 2007/0099431 A1 * | 5/2007 | Li | ............ 438/735 |
| 2007/0200477 A1 | 8/2007 | Tuominen et al. | |
| 2007/0249744 A1 | 10/2007 | Landskron et al. | |
| 2009/0305437 A1 | 12/2009 | Allemand et al. | |
| 2010/0239983 A1 | 9/2010 | Sills et al. | |
| 2011/0034029 A1 | 2/2011 | Matsunaga et al. | |
| 2012/0207940 A1 | 8/2012 | Muramatsu et al. | |
| 2013/0045877 A1 | 2/2013 | Yap et al. | |

FOREIGN PATENT DOCUMENTS

WO     2012084558 A1     6/2012

\* cited by examiner

*Primary Examiner* — Duy Deo

(74) *Attorney, Agent, or Firm* — Amerson Law Firm, PLLC

(57) ABSTRACT

A method includes forming a chemical guide layer above a process layer. A template having a plurality of elements is formed above the process layer. The chemical guide layer is disposed on at least portions of the process layer disposed between adjacent elements of the template. A directed self-assembly layer is formed over the chemical guide layer. The directed self-assembly layer has alternating etchable components and etch-resistant components. The etchable components of the directed self-assembly layer are removed. The process layer is patterned using the template and the etch-resistant components of the directed self-assembly layer as an etch mask.

18 Claims, 2 Drawing Sheets

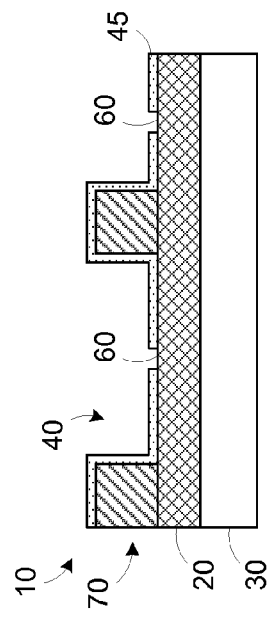
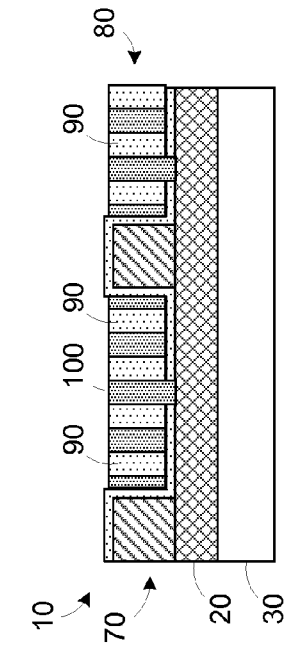
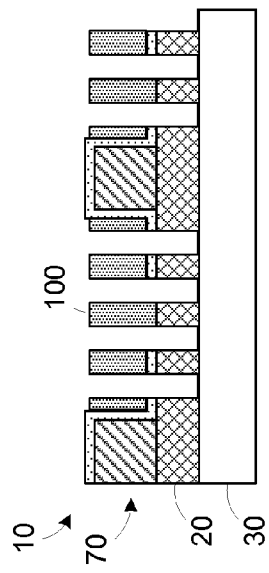
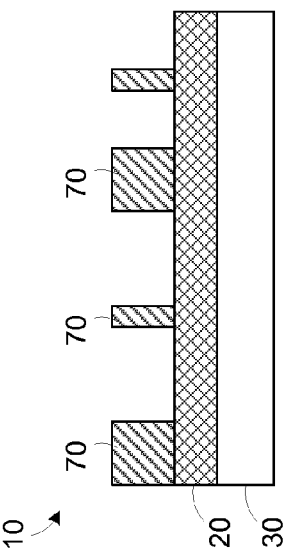
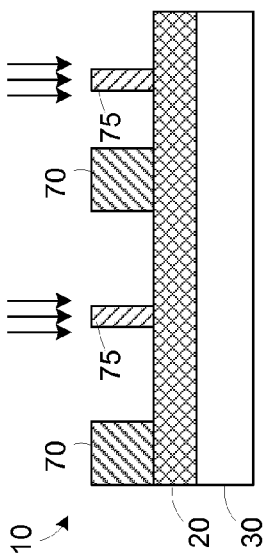
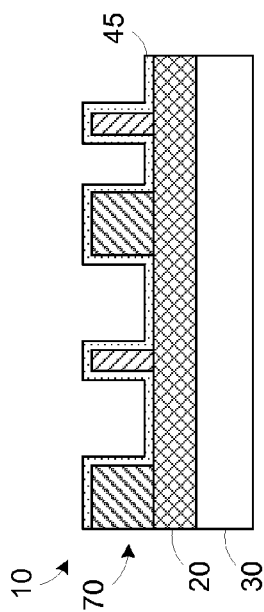

CHEMICAL AND PHYSICAL TEMPLATES FOR FORMING PATTERNS USING DIRECTED SELF-ASSEMBLY MATERIALS

BACKGROUND

The disclosed subject matter relates generally to manufacturing and, more particularly, to using chemical and physical templates for forming patterns using directed self-assembly materials.

Many technological applications require the ability to pattern precise structures with a periodicity (pitch) below 60 nm. Existing optical lithography is capable of high-throughput processing, but the patterning pitch of a single optical lithography step is limited to about 80 nm. A challenge for lithography is to devise tools, materials, and processes that can reliably, efficiently, and quickly pattern structures with smaller dimensions and reduced pitch.

Directed Self-Assembly (DSA) lithography is a materials-based approach that relies on the phase separation of certain polymeric materials. A basic DSA process consists of coating a polymeric material on a substrate over a previously formed guide structure. The guide pattern is typically formed by an optical lithography process. The polymeric self-assembly material contains two (or more) chemical components that have carefully controlled size. These components can be bonded together into polymer chains known as diblocks, such as A-A-A-A-A-A-A-A-A-B-B-B-B-B-B-B-B-B-B. Immediately after coating, the A and B components are relatively disordered, however, these components (A, B) can be induced to separate into distinct phases and thereby form features with a characteristic pitch that is defined by the chemical composition. By coating this polymer on a substrate with a pre-formed guide pattern, it is possible to "interpolate" the features between the elements of the guide pattern and reduce the pitch by a factor of 2-40 relative to the guide pattern.

While DSA has shown promise in creating large areas of straight line/space patterns with constant pitch, it is difficult to pattern lines of varying pitch and/or dimensions. Such structures are useful for semiconductor device applications. Also, the width of the pattern is limited by the characteristics of the DSA material. For example, if the distance between guide patterns exceeds a threshold, the DSA structure will become disordered.

This section of this document is intended to introduce various aspects of art that may be related to various aspects of the disclosed subject matter described and/or claimed below. This section provides background information to facilitate a better understanding of the various aspects of the disclosed subject matter. It should be understood that the statements in this section of this document are to be read in this light, and not as admissions of prior art. The disclosed subject matter is directed to overcoming, or at least reducing the effects of, one or more of the problems set forth above.

BRIEF SUMMARY OF EMBODIMENTS

The following presents a simplified summary of only some aspects of embodiments of the disclosed subject matter in order to provide a basic understanding of some aspects of the disclosed subject matter. This summary is not an exhaustive overview of the disclosed subject matter. It is not intended to identify key or critical elements of the disclosed subject matter or to delineate the scope of the disclosed subject matter. Its sole purpose is to present some concepts in a simplified form as a prelude to the more detailed description that is discussed later.

One aspect of the disclosed subject matter is seen in a method that includes forming a chemical guide layer above a process layer. A template having a plurality of elements is formed above the process layer. The chemical guide layer is disposed on at least portions of the process layer disposed between adjacent elements of the template. A directed self-assembly layer is formed over the chemical guide layer. The directed self-assembly layer has alternating etchable components and etch-resistant components. The etchable components of the directed self-assembly layer are removed. The process layer is patterned using the template and the etch-resistant components of the directed self-assembly layer as an etch mask.

Another aspect of the disclosed subject matter is seen in a method that includes forming a template having a plurality of elements above a process layer. A neutral layer is formed above the template and above the portions of the process layer exposed between adjacent elements of the template. Selected portions of the template and the portions of the neutral layer defined above the selected portions are removed to expose the process layer disposed below the selected portions. A directed self-assembly layer is formed over the neutral. The directed self-assembly layer has alternating etchable components and etch-resistant components. The etchable components of the directed self-assembly layer are removed. The process layer is patterned using the template and the etch-resistant components of the directed self-assembly layer as an etch mask.

BRIEF DESCRIPTION OF THE SEVERAL VIEWS OF THE DRAWINGS

The disclosed subject matter will hereafter be described with reference to the accompanying drawings, wherein like reference numerals denote like elements, and:

FIG. 7 is a diagram of a semiconductor device including a process layer and a template formed above the process layer;

FIG. 8 is a diagram of the device of FIG. 7 following the exposure and baking of a portion of the template;

FIG. 9 is a diagram of the device of FIG. 8 following the formation of a neutral layer above the template;

FIG. 10 is a diagram of the device of FIG. 9 following removal of the exposed portions of the template to remove portions of the neutral layer formed thereabove;

FIG. 11 is a diagram of the device of FIG. 10 following the formation of a directed self-assembly (DSA) layer above the process layer; and FIG. 12 is a diagram of the device of FIG. 11 following the removal of etchable components of the DSA layer and the etching of the process layer using the template and etch-resistant components of the DSA layer as an etch template.

Figure 1:
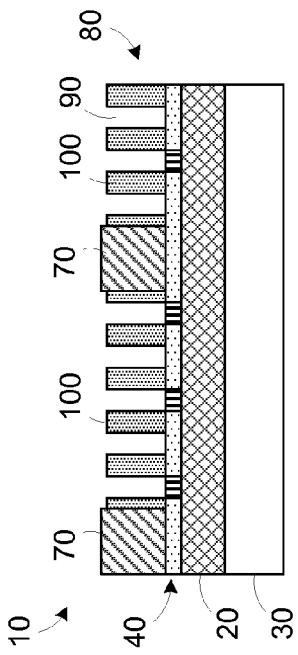
FIG. 1 is a cross-section diagram of a semiconductor device including a process layer and a chemical guide layer.

While the disclosed subject matter is susceptible to various modifications and alternative forms, specific embodiments thereof have been shown by way of example in the drawings and are herein described in detail. It should be understood, however, that the description herein of specific embodiments is not intended to limit the disclosed subject matter to the particular forms disclosed, but on the contrary, the intention is to cover all modifications, equivalents, and alternatives falling within the spirit and scope of the disclosed subject matter as defined by the appended claims.

DETAILED DESCRIPTION

One or more specific embodiments of the disclosed subject matter will be described below. It is specifically intended that the disclosed subject matter not be limited to the embodiments and illustrations contained herein, but include modified forms of those embodiments including portions of the embodiments and combinations of elements of different embodiments as come within the scope of the following claims. It should be appreciated that in the development of any such actual implementation, as in any engineering or design project, numerous implementation-specific decisions must be made to achieve the developers' specific goals, such as compliance with system-related and business related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure. Nothing in this application is considered critical or essential to the disclosed subject matter unless explicitly indicated as being "critical" or "essential."

The disclosed subject matter will now be described with reference to the attached figures. Various structures, systems and devices are schematically depicted in the drawings for purposes of explanation only and so as to not obscure the disclosed subject matter with details that are well known to those skilled in the art. Nevertheless, the attached drawings are included to describe and explain illustrative examples of the disclosed subject matter. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Referring now to the drawings wherein like reference numbers correspond to similar components throughout the several views and, specifically, referring to FIGS. 1 through 6, the disclosed subject matter shall be described in the context of an illustrative semiconductor device 10 in an intermediate stage of manufacture. The device 10 includes a process layer 20 formed above a substrate 30. The substrate 30 may be a bulk substrate or a semiconductor on insulator substrate. The process layer 20 represents one or more layers to be patterned, and may include one or more layers that have desirable interactions with the DSA materials. For example, the process layer 20 might include a layer that is substantially neutral toward the DSA material and/or a layer that induces the DSA material to orient with phase boundaries that are perpendicular to the substrate. The process layer 20 might also include layers that are chosen for having antireflective properties to improve photolithographic patterning. The process layer 20 might also include intermediate etch transfer layers to facilitate etch transfer of the DSA pattern into underlying layers. The process layer 20 may also include a hard mask layer that is used to pattern another underlying layer formed on the substrate 30.

In FIG. 1, a chemical guide layer 40 is formed above the process layer 20. The chemical guide layer 40 includes neutral portions 50 and pinning portions 60. In general, the neutral portions do not interact with a subsequently formed DSA material, while the pinning portions 60 serve to anchor one component of the DSA material, as described in greater detail below. Techniques for forming chemical guide layers 40 are known to those of ordinary skill in the art. For example, a neutral layer may be formed above the process layer 20 and patterned using photoresist to define the neutral portions 50. Gaps in the neutral portions expose the underlying process layer 20, which acts as a pinning material. For example, an antireflective coating in the process layer 20 may preferentially bind to one components of the DSA material. In another example, a layer of pinning material, such as cross-linked polystyrene, may be formed and patterned using photoresist to define the pinning portions 60. A random brush layer may be grafted to the process layer 20 to define the neutral portions 50. In yet another technique, a photoresist template may be formed and covered with a neutral layer using a spin-on process. The photoresist may be developed to lift off the neutral material in the regions covered by the photoresist to define the neutral portions 50 in the uncovered regions and pinning portions 60 in the gaps.

Figure 2:
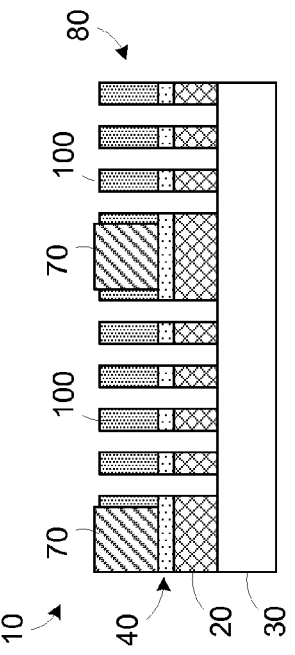
FIG. 2 is a diagram of the device of FIG. 1 following the formation of a template above the process layer.

As shown in FIG. 2, a template 70 is formed above the process layer 20. In the illustrated embodiment, the template 70 is formed using a photoresist material and patterned to expose the chemical guide layer 40 as illustrated. The process layer 20 may include a bottom anti-reflective coating (BARC) to facilitate the photolithography patterning process to form the template 70. Exemplary processes for forming the template 70 include argon fluoride (ArF) immersion lithography, ArF dry lithography, KrF lithography, UV lithography, extreme ultraviolet (EUV) lithography, electron beam lithography, and imprint lithography. The template 70 may also be modified using resist trim dry etch or chemical shrink processes known in the art to reduce the width of the elements of the template 70 after they are formed by lithography. The elements of the template 70 may have different sizes to facilitate patterning of non-periodic features in the process layer 20.

In the Figures that follow, the chemical guide layer 40 and the template 70 are used in conjunction with a directed self-assembly (DSA) material to pattern features in the process layer 20 using graphoepitaxy patterning process. Exemplary DSA materials include di-block copolymers, tri-block copolymers, ring copolymers, star copolymers, blends of homopolymers, blends of copolymers, and combinations thereof. The DSA material includes two (or more) chemical components that have controlled sizes. These components are bonded together into polymer chains known as diblocks, such as A-A-A-A-A-A-A-A-A-A-B-B-B-B-B-B-B-B-B-B. The self-assembly material is typically applied using a spin-coating process. Immediately after coating, the A and B (and C, D, etc.) components are relatively disordered. The A and B components are induced to separate into distinct phases and thereby form features with a characteristic pitch that is defined by the chemical composition. The DSA process is driven by thermodynamic instability. This phase separation can be promoted by any of several annealing processes, such as thermal annealing (baking), solvent annealing, or combinations thereof. The DSA material "interpolates" the features between the guide patterns and can reduce the pitch by a factor of 2-40 relative to the template 70. For DSA materials, the width of the space between features in the template 70 is constrained to be approximately an integer multiple of the natural period of the DSA material to avoid introducing defects within the DSA material. The DSA material has intrinsic phase morphology and periodicity/pitch. These properties are determined by the chemical composition of the material and can be fine-tuned by changing the chemical composition. Processes for forming the DSA materials and processing the deposited material to form the ordered pattern are known to those of ordinary skill in the art, so they are not described in greater detail herein.

In general, the DSA material includes an etchable component and an etch-resistant component. Depending on the particular DSA material selected, either the etchable material or the etch-resistant material wets the sidewalls of the template 70. Further, the template 70 can be treated to adjust the wetting properties with respect to the DSA materials. For example, the template 70 can be treated by exposure to UV radiation, an aqueous base, or a surfactant solution. The template 70 can also be treated by grafting of polymeric, oligomeric, or other components to adjust the wetting properties with respect to the DSA materials. The surface of the template 70 can also be treated by deposition of material by plasma deposition, chemical vapor deposition, atomic layer deposition, or combinations thereof to adjust the wetting properties. It should be noted that the template 70 can comprise a resist material or a material that is patterned from a resist material. Further, the template 70 can be treated by known methods to adjust the wetting properties with respect to the DSA materials. The particular choice of material and processing depends on the construct of the features to be patterned in the underlying process layer 20.

Figure 3:
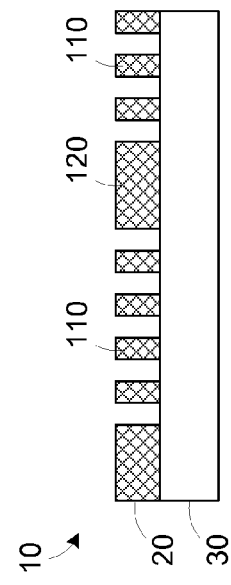
FIG. 3 is a diagram of the device of FIG. 2 following the formation of a directed self-assembly (DSA) layer above the process layer.

In FIG. 3, a DSA layer 80 is formed above the process layer 20 and its structure is controlled by its inherent properties and the structure imposed by the chemical guide layer 40 and the template 70. The DSA layer 80 includes an etchable component 90 and an etch-resistant component 100. In the example of FIG. 3, the etch-resistant component 100 wets the template 70. Of course, the pattern may be adjusted by having the etchable component 90 wet the template 70.

Figure 4:
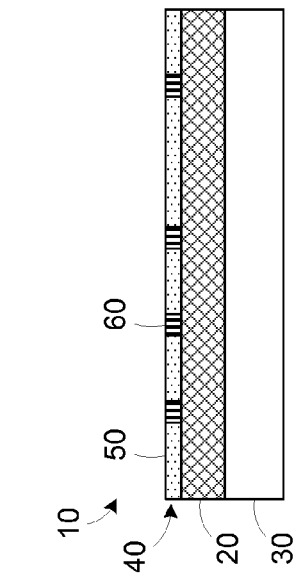
FIG. 4 is a diagram of the device of FIG. 3 following the removal of etchable components of the DSA layer.

In FIG. 4, the etchable component 90 of the DSA layer 80 is removed formed above the process layer 20. For a DSA material of polystyrene (PS) and polymethylmethacrylate (PMMA), the PMMA component can be selectively removed by dry/plasma etching using oxygen and/or argon and/or fluorocarbon gas chemistry, for example. The PMMA component can also be removed in a two-step process, starting with a UV exposure of the copolymer, which substantially degrades the PMMA block and/or cross-links the PS block, followed by wet dissolution of the PMMA in a selective solvent such as acetic acid, for example. These etch procedures may be generalized to work for other copolymers that include at least 1 acrylate block and 1 non-acrylate block. For a copolymer of polystyrene (PS) and polydimethylsiloxane (PDMS), the PS block can be selectively removed by dry/plasma etching using oxygen and/or argon gas chemistry, for example. This etch procedure can also be generalized to work for other copolymers that include at least one element which confers added etch resistance, such as Si, Zr, Hf, etc.

Figure 5:
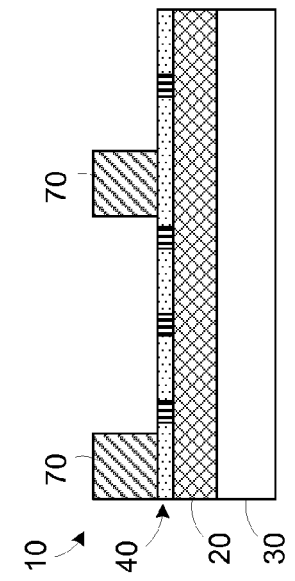
FIG. 5 is a diagram of the device of FIG. 4 illustrating the etching of the process layer using the template and etch-resistant components of the DSA layer as an etch template.
Figure 6:
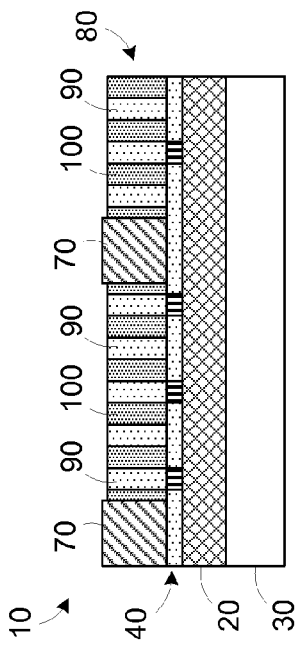
FIG. 6 is a diagram of the device of FIG. 5 following the removal of the template and the remaining portions of the DSA layer.

The etch template formed by the template 70 and the etch-resistant portions 100 of the DSA layer 80 is used to etch the process layer 20 as illustrated in FIG. 5, and the remaining portions of the template 70, the DSA layer 80, and the chemical guide layer 40 are removed in FIG. 6. The particular etch processes used depend on the material of the process layer 20. Those of ordinary skill in the art are familiar with etch processes to etch various semiconductor materials, metals, or dielectric materials that may be present in the process layer 20 and for removing the remaining portions of the template 70, the DSA layer 80, and the chemical guide layer 40.

As shown in FIG. 6, the etched process layer 20 includes periodic components 110 defined by the remaining portions 100 of the DSA layer 80 and non-periodic components 120 defined by the template 70. The pitch of the periodic components 110 is characterized by the intrinsic pitch of the DSA layer 80, while the non-periodic components 120 are formed based on the dimensions and spacing of the template 70. Note that the non-periodic components 120 may have different sizes.

FIGS. 7-12 illustrate an alternative technique for forming the chemical guide layer 40. In FIG. 7, the template 70 is formed above the process layer 20. In FIG. 8, a patterned exposure and bake process is used to change the solubility of portions 75 of the template 70 in an aqueous developer. A UV exposure process modulates the solubility of the photoresist in a developer solvent/solution. The selective treatment process may be conducted using a masking technique or a directed exposure technique. The baking process also hardens the template 70 and the portions 75.

In FIG. 9, a neutral layer 50 is formed (e.g., by spin coating) above the process layer 20 and the template 70, 75. In FIG. 10, a lift-off development process is conducted to remove the exposed portions of the template 75. The portions of the neutral layer 50 disposed above the exposed template portions 70 are removed, and the exposed portions of the process layer 20 serve as the pinning portions 60 to define the chemical guide layer 40.

In FIG. 11, the DSA layer 80 is formed, including the etchable components 90 and the etch resistant components 100. Processing continues as described above to remove the etchable components 90 and etch the process layer using the template 70 and etch resistant components 100 as an etch mask, as shown in FIG. 12.

Using the combination of the template 70 and the chemical guide layer 40, as described in FIGS. 1-12, the width of the pattern formed using the periodic components 110 may be increased as compared to using the template 70 alone. In general, the maximum width between the template elements without an underlying chemical guide layer is about 40 times the natural period of the DSA material. To avoid defects in the DSA layer 80. The chemical guide layer 40 serves to order the components of the DSA layer 80 between elements of the template 70. So, if the distance between members of the template 70 is greater than the maximum distance for the DSA material that allows for ordered formation of the etchable and etch-resistant components 90, 100, the chemical guide layer 40 supports the ordering across the entire span. The template 70 may also be used to define patterns for alignment, registration, or other metrology.

Patterning the process layer 20 using the techniques described herein allows periodic patterns 110 to be formed using the DSA layer 80 and non-periodic patterns 120 to be formed using the template 70. Non-periodic elements 120 may be used for functional parts of electrical devices, alignment, and/or registration patterns. For a DSA process, the width of the space between features is constrained to be (approximately) an integer multiple of the natural period of the DSA material or defects will occur within the DSA material. Using the techniques described herein, non-periodic elements can be created by tuning the width of the features in the template 70 in conjunction with the integration process to meet the requirements of the device design. The size of the non-periodic elements 120 is determined by the final width of the template features and the proximity of the etched or unetched phase of the DSA material.

The particular embodiments disclosed above are illustrative only, as the disclosed subject matter may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the disclosed subject matter. Accordingly, the protection sought herein is as set forth in the claims below.

We claim:

1. A method, comprising:
   forming a chemical guide layer above a process layer, wherein the chemical guide layer comprises a neutral layer;
   forming a template having a plurality of elements above the process layer, wherein the chemical guide layer is disposed on at least portions of the process layer disposed between adjacent elements of the template and the neutral layer covers portions of the process layer disposed between adjacent elements of the template and wherein the neutral layer includes gaps exposing portions of the process layer, the exposed portions of the process layer comprising a pinning material for a directed self-assembly layer;
   forming the directed self-assembly layer over the chemical guide layer, the directed self-assembly layer having alternating etchable components and etch-resistant components;
   removing the etchable components of the directed self-assembly layer; and
   patterning the process layer using the template and the etch-resistant components of the directed self-assembly layer as an etch mask.

2. The method of claim 1, wherein non-periodic elements are defined in the process layer by the template and periodic elements are defined in the process layer by the etch-resistant components of the directed self-assembly layer.

3. The method of claim 1, wherein forming the template comprises forming the template above the chemical guide layer.

4. The method of claim 1, further comprising selectively removing at least one element of the template prior to the patterning of the process layer.

5. The method of claim 4, wherein selectively removing the at least one element of the template further comprises:
   exposing the at least one element to a radiation source; and
   removing the at least one element.

6. The method of claim 1, wherein forming the template further comprises:
   forming a photoresist layer over the process layer; and
   patterning the photoresist layer to define the template.

7. The method of claim 6, further comprising performing at least one of a resist trim etch or a chemical shrink on the template.

8. The method of claim 1, further comprising performing a surface treatment of the template to affect whether the etchable components or the etch-resistant components wet the template.

9. The method of claim 1, wherein portions of the directed self-assembly layer adjacent the elements of the template comprise etch-resistant components.

10. The method of claim 1, wherein at least two of the elements of the template have different sizes.

11. The method of 1, wherein a material of the directed self-assembly layer comprises at least one of a di-block copolymer, a tri-block copolymer, a ring copolymer, a star copolymer, a blend of homopolymers, a blend of copolymers, or a combination thereof.

12. A method, comprising:
   forming a template having a plurality of elements above a process layer;
   forming a neutral layer above the template and above the portions of the process layer exposed between adjacent elements of the template;
   removing selected portions of the template and portions of the neutral layer defined above the selected portions to expose the process layer disposed below the selected portions;
   forming a directed self-assembly layer over the neutral, the directed self-assembly layer having alternating etchable components and etch-resistant components;
   removing the etchable components of the directed self-assembly layer; and
   patterning the process layer using the template and the etch-resistant components of the directed self-assembly layer as an etch mask.

13. The method of claim 12, wherein non-periodic elements are defined in the process layer by the template and periodic elements are defined in the process layer by the etch-resistant components of the directed self-assembly layer.

14. The method of claim 12, wherein the exposed portions of the process layer comprise a pinning material for the directed self-assembly layer.

15. The method of claim 12, wherein forming the template further comprises forming a photoresist layer over the process layer and patterning the photoresist layer to define the template, and wherein selectively removing the selected portions of the template comprises exposing the selected portions to a radiation source and dissolving the selected portions.

16. The method of claim 12, wherein a material of the directed self-assembly layer comprises at least one of a di-block copolymer, a tri-block copolymer, a ring copolymer, a star copolymer, a blend of homopolymers, a blend of copolymers, or a combination thereof.

17. A method, comprising:
   forming a template having a plurality of elements above a process layer;
   forming a chemical guide layer above the process layer, wherein the chemical guide layer is disposed on at least portions of the process layer disposed between adjacent elements of the template and wherein forming the chemical guide layer comprises:
      exposing selected portions of the template to a radiation source;
      forming a neutral layer above the template and above the portions of the process layer exposed between adjacent elements of the template; and
      removing the selected portions of the template and the portions of the neutral layer defined above the selected portions to expose the process layer disposed below the selected portions;

forming a directed self-assembly layer over the chemical guide layer, the directed self-assembly layer having alternating etchable components and etch-resistant components;

removing the etchable components of the directed self-assembly layer; and patterning the process layer using the template and the etch-resistant components of the directed self-assembly layer as an etch mask.

18. The method of claim 17, wherein the exposed portions of the process layer define pinning portions for the directed self-assembly layer.

* * * * *